United States Patent [19] [11] 3,969,671
Smith [45] July 13, 1976

[54] CHARGING CURRENT VOLTMETER

[76] Inventor: David A. Smith, Rte. 1, Box 707, Willcox, Ariz. 85643

[22] Filed: Nov. 7, 1974

[21] Appl. No.: 521,646

Related U.S. Application Data

[63] Continuation-in-part of Ser. No. 271,909, July 14, 1972, abandoned.

[52] U.S. Cl. .............................. 324/119; 324/109
[51] Int. Cl.² ..................... G01R 19/22; G01R 1/20
[58] Field of Search .................... 324/119, 109, 72.5

[56] References Cited
UNITED STATES PATENTS
2,091,521 8/1937 Pattison ............................ 324/109

Primary Examiner—R. V. Rolinec
Assistant Examiner—Ernest F. Karlsen
Attorney, Agent, or Firm—Cahill, Sutton & Thomas

[57] ABSTRACT

A single probe voltmeter for determining the voltage potential of high voltage transmission lines is disclosed. The voltmeter includes a capacitor having a spherical first plate connected to the transmission line through a rectifier network. The second plate of the capacitor is formed by the physical surroundings. An ammeter is connected across the rectifier network to provide an indication of the charging current for the spherical capacitor, which charging current is essentially a function of the transmission line voltage such that the ammeter provides an indication of the voltage potential on the transmission line.

9 Claims, 7 Drawing Figures

U.S. Patent July 13, 1976 Sheet 3 of 3 3,969,671
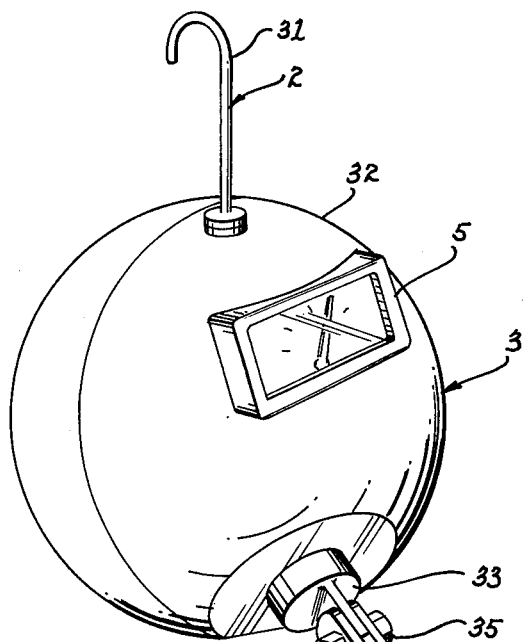
FIG. 5
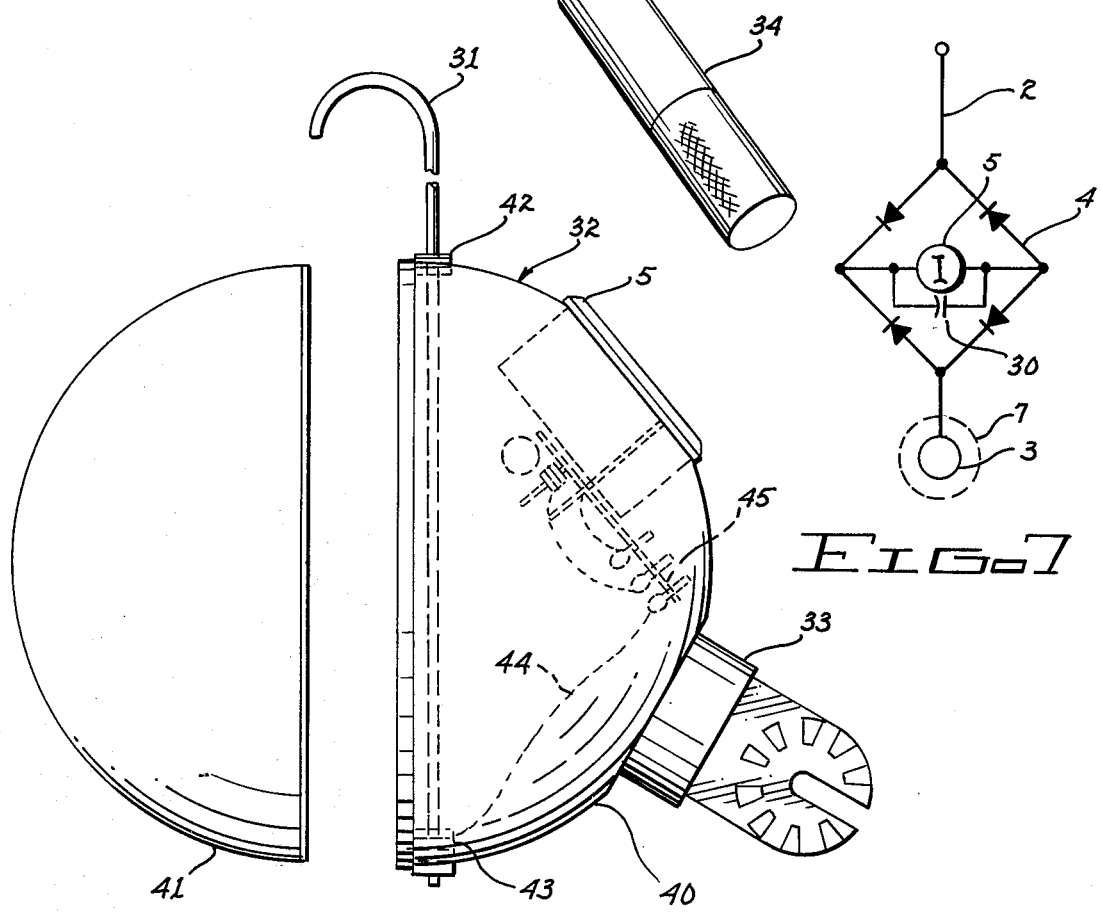
FIG. 6
FIG. 7

CHARGING CURRENT VOLTMETER

The present application is a continuation-in-part of a patent application entitled "CHARGING CURRENT VOLTMETER", assigned Ser. No. 271,909 and filed on July 14, 1972, now abandoned, and describing an invention of the present inventor.

The present invention relates to voltmeters, and more particularly, to voltmeters for measuring the voltage on a high tension transmission line.

High tension lines, particularly overhead transmission lines, present a unique problem in determining whether the line is energized. The high potential of the line is a definite safety hazard to any person approaching the line for test purposes unless he is well insulated from the ground or the line. Generally, this requires the use of a truck having an insulated man-carrying hoist if the voltage detection is to be made mid-span. Or, a lineman must climb a pole and carry with him insulating equipment. Where there is a need to determine whether guy wires or downed lines are energized, either of the above methods are inadequate or unsafe.

To reduce the need for peripheral safety equipment, various types of dual probe meters have been developed. In one type, each of a pair of long poles is hooked onto one of a pair of transmission lines or connected to a transmission line and ground. A meter, electrically connected across the poles, provides an indication of the voltage therebetween. With appropriate metering equipment, the phase relationship between the lines can also be determined. When operating properly, this voltage measuring system is effective. However, as a direct electrical path, though highly resistive, extends across the transmission lines, a breakdown of the resistance can cause injury and damage. In another type of test system, an indictive device is placed in proximity to the transmission line being tested and provides an indication of the strength of the electrostatic field surrounding the line. The device generally has a minimum voltage value which it can detect. Therefore, its usefulness is limited to checking whether an undamaged line is energized at the correct voltage level. The device is not useable for low voltage determinations such as might exist on guy wires or downed lines. A yet third type of tester is responsive to an electrostatic field and emits a warning signal. This type of tester is of the go-no-go type and cannot provide a relative voltage reading above a specified minimum. Usually, the minimum voltage is still sufficient to severely injure a lineman. Thus, a supposedly "dead" line may not in fact be dead and can cause injury. A fourth type of high voltage tester adapted for testing high tension transmission line insulators and described in U.S. Pat. No. 2,091,531 provides a voltage reading commensurate to the charging current for a cylindrically shaped capacitor. The shape of the capacitor renders it highly susceptible to variation in charging current due to the capacitive effect of the adjacent electrically charged or uncharged elements. Thus, the obtained voltage reading is highly inaccurate, except under closely controlled conditions.

It is therefore a primary object of the present invention to provide a single probe passive meter for determining the voltage potential on a high tension line with an accuracy of ten percent or better.

Another object of the present invention is to provide a voltmeter for high tension lines which voltmeter incorporates a single plate spherical capacitor.

Yet another object of the present invention is to provide an indication of the voltage potential of an electrically conducting line from the charging current for an electrically connected spherical capacitor.

A further object of the present invention is to provide a non-hazardous voltmeter for high tension lines.

A yet further object of the present invention is to provide a voltage determining instrument incorporating a spherical capacitor, which capacitor houses a meter element and ancillary electrical components.

These and other objects of the present invention will become apparent to those skilled in the art as the description thereof proceeds.

The present invention may be described with greater specificity and clarity with reference to the following figures, in which:

FIG. 3 illustrates the present invention in conjunction with a phase angle indicator.

FIG. 5 illustrates apparatus embodying the present invention.

FIG. 6 illustrates a side view of the components of the apparatus shown in FIG. 5.

FIG. 7 is a variant of the schematic shown in FIG. 1.

Figure 1:
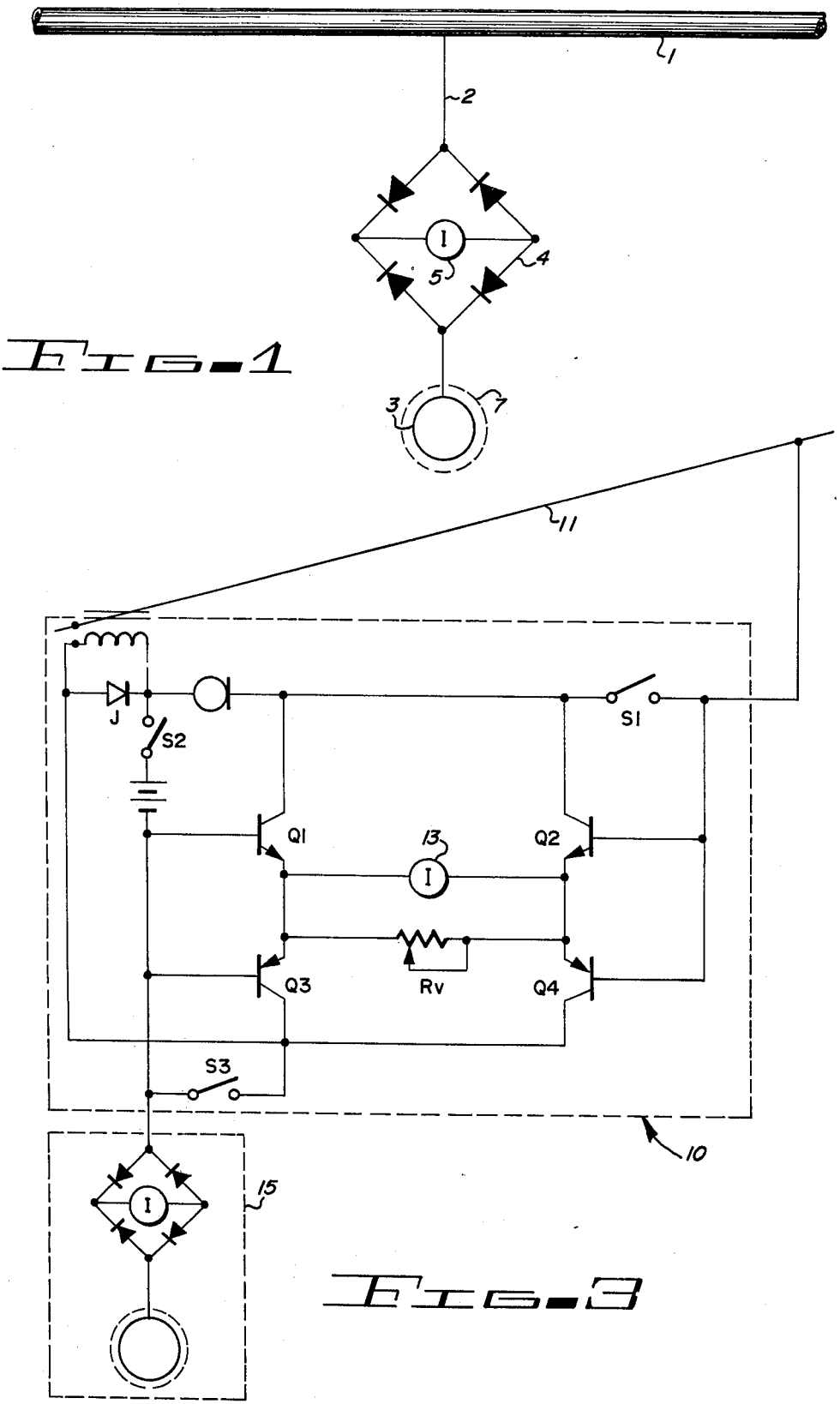
FIG. 1 illustrates a schematic of a voltmeter constructed in accordance with the present invention.

To overcome the safety hazards attendant active voltmeters for use on high tension transmission lines, some early work has been done in an attempt to employ the charging current of a capacitor to represent the voltage potential under test, as illustrated in U.S. Pat. No. 2,091,521, issued to D. R. Pattison. The Pattison patent teaches a cylindrically configured capacitor connectable to an insulator under test through a probe; a meter movement is disposed exterior to the capacitor and intermediate the capacitor and the probe. The cylindrical capacitor is mounted within a cylindrically shaped cavity of a manually manipulated pole. The sensitivity of the Pattison device is a function of the length of the cylindrical capacitor and its proximity to the surrounding electrostatic field, i.e., adjacent transmission lines, ground, etc. As stated in the Pattison patent, the sensitivity of the device can be increased or decreased by substituting different length cylindrical capacitors. The voltage readings of the Pattison device will vary over a range of 4 to 1 when connected to different phases of a transmission line due to the different juxtapositioned capacitances of the transmission line. Further, the proximity of the neutral conductor (if any) and any low voltage lines will cause further variation. Because of these enumerated variations in accuracy, the Pattison device is, at best, a tool useable where approximate readings above some predetermined minimum value are adequate.

As the electrostatic fields in the vicinity of transmission lines vary radically with the geometry of the lines, the number of phases and the number of circuits, an accurate voltmeter must be essentially immune to such variations. It must also be a passive and not an active meter for safety reasons. Before the criteria for developing an accurate capacitively coupled voltmeter can be determined, the following basic considerations must be understood:

a. the existence of a significant amount of volt amperes, despite a low charging current renders feasible the use of a miniature capacitive body connected through a current transformer;

b. the electrostatic field adjacent a small conductor is essentially immune to the potential of a remote (more than ten conductor diameters away) conductor;

c. the shunt effect of the conductor under test can compensate for variations of different conductor sizes of adjacent phases;

d. the spacing of the different phase conductors in a transmission line is relatively constant;

e. small sharply defined objects tend to suffer from corona discharge;

f. the ratio of partial capacitance due to remote conductors to the total capacitance varies as:

$$\frac{Cp}{Ct} = 1 - K \sin\left(\frac{\phi}{2}\right)$$

where $K \approx \frac{1}{2}$ to 1 and $\phi$ is equal to one-half of the angle defined by the lateral extremity of the capacitive body with respect to a point on the remote conductor perpendicular to the mid-point of the capacitive body. After thorough investigation and study of the above considerations, the following criteria for accurate capacitively coupled voltmeter were developed:

1. the dimensions of the capacitive body must be minimized so that it may be maintained in the relatively predictable fields near the conductor being measured;
2. the dimension of the capacitive body parallel to the conductor under test must be minimized; and
3. the minimum dimensions and configuration are set by the corona extinction level.

It is well known that the capacitive value of a long, narrow cylinder varies linearly with length and logarithmically with the radius of the cylinder. Additionally, a cylinder is easy to package within a non-conductive medium and is easily manually manipulatable. Hence, the reasons for the choice of capacitive body in the Pattison patent appears obvious. It also allows easy substitution of various length cylinders to accommodate different degrees of sensitivity or different voltage ranges. However, the ratio of the capacitance of a cylinder with a length to diameter ratio of 10 to 3 to the capacitance of a sphere with a radius of 1 is approximately 1 to 1.4.

From the above discourse, it seems apparent that a sphere comes closer to satisfying all of the developed criteria to optimize the configuration of the capacitive element for a high tension transmission line voltmeter.

The impedance of a sphere is determined by $$Z_c = -j \frac{1}{wc};$$

or $$Z_c = \frac{-\sqrt{-1}}{2fc}.$$

Substituting the equation for the capacitance of a sphere, $$Z_c = \frac{-\sqrt{-1}}{8\pi^2 fer}.$$

The maximum power transfer occurs when the dissipative load of the meter ($R_m$) is equal to the source impedance, or $$P = \frac{V^2}{Z_c + R_m}.$$

P is at a maximum when $Z_c = R_m$. By measuring the current flowing through the load, that is, the charging current for the spherical capacitor, an indication of the voltage at the source may be obtained. Thus, it has been established that a spherical capacitor can be employed to draw sufficient charging current to provide a sensitive reading on a voltmeter and yet the spherical capacitor can be of lesser size than any other configuration and thereby be less affected by adjacent electrostatic fields than any other configuration.

Referring to FIG. 1, there is shown apparatus incorporating the physical elements to obtain an indication of the voltage (V) in accordance with the above analysis. A section of a transmission line 1 is tapped by a single probe or electrical conductor 2. The conductor 2 connects the transmission line 1 through a rectifier network 4 to a plate 3 of a capacitor, which plate is spherical. The second plate of the capacitor, representatively shown by dashed line 7 is the physical surroundings, which is often, but not wholly correctly, referred to as ground. For simplicity in terminology, plate 3 will be referred to as spherical capacitor 3 hereinafter. As there is no second electrode or probe associated with the voltmeter, the generally required insulating elements associated with dual electrode devices have been obvious. Hence, only the corona voltage limits must be satisfied to obtain the necessary insulation level.

The rectifier network 4 may be a single phase full wave network as shown. An ammeter 5, connected across the recitifer network 4, indicates the magnitude of the charging current through conductor 2.

The current through ammeter 5 is proportional to the voltage, frequency and capacitance. For most transmission lines, the frequency is essentially constant and at most, varies plus or minus two tenths of a percent (0.2%). The capacitance of the spherical capacitor 3 to the ground 7 is essentially stable. Thus, the main variable affecting the flow of current through ammeter 5 is the voltage of the line under test. Therefore, the ammeter 5, measuring the current, will provide an indication of the voltage on the transmission line 1.

Figure 2:
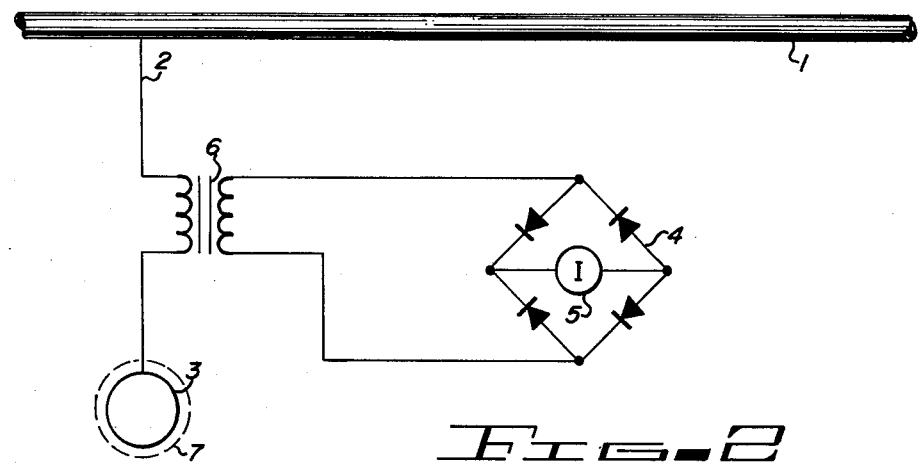
FIG. 2 illustrates a modification of the present invention.

By including a current transformer 6 intermediate the conductor 2 and ammeter 5, as shown in FIG. 2, the sensitivity of the apparatus of the present invention can be increased. The transformer matches the impedance of the meter to the capacitor. That is, $$P = \frac{V^2}{Z_c + T^2 R_m}$$

where T = turns ratio of the transformer. It is anticipated that this embodiment will be used where the voltage of the transmission line is between one and five kilovolts.

The range of the ammeter 5 can be expanded in the expected scale by the following modification. An appropriately valued Zener diode is connected in series with the ammeter 5 and an appropriately valued resistor is connected across the ammeter and the Zener diode. For damping of the ammeter 5, a capacitor 30 may be placed thereacross, as shown in FIG. 7.

Referring to FIG. 5, there is shown embodiment of the schematic depicted in FIG. 1. The single probe of the voltmeter, or conductor 2, is formed as a rigid hook 31. The hook is secured to and extends from the electrical spherical capacitor 3, which capacitor is formed of an electrically conducting shell 32. Ammeter 5 is attached to and supported by shell 32 with at least part of the ammeter being internal to the shell. A pivoting attachment mechanism 33 extends from the lower surface of shell 32 and serves as the interfacing mechanism between shell and an electrically insulated manually manipulated pole 34. Pivotable adjustment means, such as nut and bolt means 35 may be employed to vary the angular relationship between hook 31 and pole 34 to aid in attaching the hook to the line under test.

A more detailed view of the invention presented in FIG. 5 is illustrated in FIG. 6. Shell 32 is formed of two hollow hemispheres 40 and 41 to facilitate installation and repair of the internally mounted components. Hook 31 is rigidly attached to but electrically insulated from hemisphere 40 by non-electrically conducting bushings 42 and 43. A conductor 44 is electrically connected to hook 31 and extends therefrom to an electrical circuit disposed upon circuit board 45. The rectifier network 4, shown in FIGS. 1, 2 or 7, is mounted upon the circuit board and connected to the ammeter 5 and the shell 32, per the pertaining schematic. It is to be understood that the meter movement and attendant electrical components may be mounted external but close to the spherical capacitor.

In one model of the present invention, spherical capacitor 3 was formed of a pair of aluminum hemispheres of approximately five inch radius; hook 31 was of standard bar stock extending approximately 4 inches from the shell; ammeter 5 was a commercially available meter movement electrically modified to provide a reading of 6000 VAC; and, pole 34 was of wood attached to the shell by a commercially available fitting. The model showed excellent linearity as the voltage input to a 5KV transmission line under test was varied. Moreover, adjacent transmission line spacing of 2 feet or more had no effect on the meter output. Hence, the model proved that the interbody capacitance of adjacent transmission lines as found in the field have no effect on a voltmeter constructed in accordance with the present invention.

In operation, the electrical conductor 2 can be attached to an overhead transmission line 1 with a standard "hot stick." The ammeter 5, suspended from the transmission line, can then be read to obtain an indication of the voltage of the transmission line. It is to be noted that the apparatus does not provide a current path to any other element, such as another line or ground.

Similarly, the present invention can be used to obtain a voltage reading for underground power cables. Guy wires and grounding systems can be tested, which testing is not possible with conventional two probe voltmeters. Downed transmission lines can also be tested to determine whether they are "hot" due to direct or capacitive coupling with adjacent energized transmission lines.

A further application of the present invention is shown in FIG. 3. A phase angle meter 10, having a balanced bridge network, is used to determine the angular relationship between the voltage and current in line 11. Meters 10, such as the type shown or similar ones, are well known to those skilled in the art. Ammeter 13 is of the zero center type with the deflection being indicative of the phase angle and power flow.

The addition of the present invention, shown collectively within dotted line 15, will indicate a voltage perturbation if the phase angle of the remaining phases is off. Thus, a correction angle can be added to the phase angle of the outside phases because the apparent error is proportional to the voltage reading perturbations. The direction of phase rotation must, of course, be known.

Figure 4:
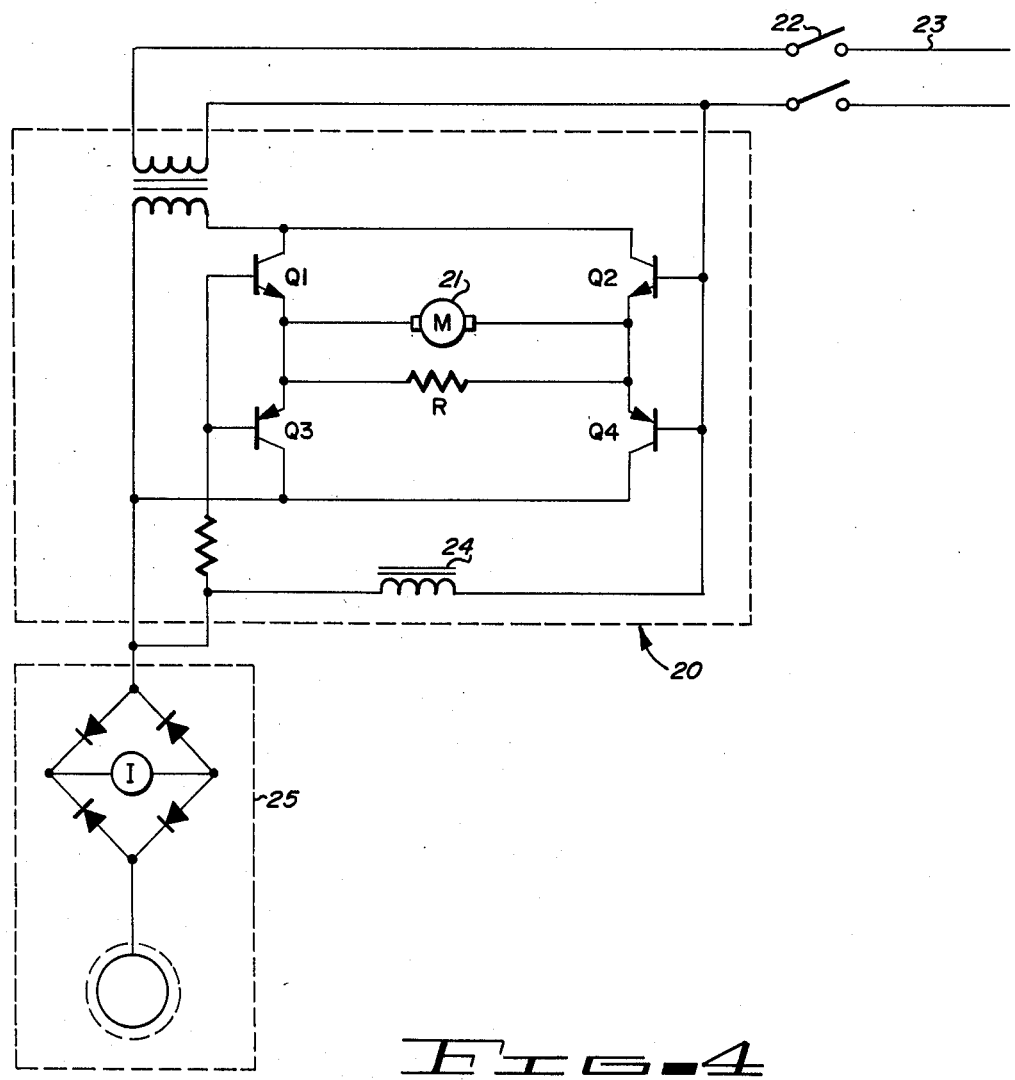
FIG. 4 illustrates the present invention in conjunction with a power flow sensor.

FIG. 4 illustrates a balanced bridge network 20, similar to that shown in FIG. 3, to determine the direction of power flow. The meter 13 (FIG. 3) has been replaced by a motor 21, mechanically connected to switch 22 in transmission line 23. An inductor 24 is added to shunt the gating transistors. The purpose of inductor 24 is to shift the reference voltage by almost 90°. The voltmeter of the present invention, shown collectively within dotted lines 25, is connected to the reference voltage. This power flow detector is especially useful in power systems having multiple possible undesired alternate power feed sources.

In operation, the bridge network 20 will provide a current flow through motor 21 and energize the latter in response to a change in power flow. Energized motor 21 will cause switch 22 to open and disconnect the transmission line 23. An ammeter 13 replacing the motor 21 in FIG. 4 will indicate the direction of power flow. Thus, the present invention can be used to identify the power feed source or act as an operating device when there has been a change in power flow.

In conclusion, the single probe voltmeter shown and described provides an indication of the voltage present on high tension lines. It may also be used in conjunction with other equipment, such as phase and power flow indicators.

While the principles of the invention have now been made clear in an illustrative embodiment, there will be immediately obvious to those skilled in the art many modifications of structure, arrangement, proportions, the elements, materials and components, used in the practice of the invention which are particularly adapted for specific environments and operating requirements without departing from those principles.

I claim:

1. A single probe voltmeter for providing an indication of the voltage potential of a high tension transmission line, said voltmeter comprising:
   a. a single probe electrically contactable to the line under test for conveying a flow of current from the line;
   b. a spherical capacitance means electrically connected to the line through said single probe;
   c. a rectifier network electrically disposed intermediate said single probe and said spherical capacitance means for rectifying the current flowing through said single probe to said spherical capacitance means; and
   d. an ammeter electrically disposed across said rectifier network, said ammeter being responsive to the current flowing through said rectifier network to charge said spherical capacitance means;
   e. said ammeter being effective to provide an indication of the charging current which is reflective of the voltage potential of the line;
   f. said spherical capacitance means being effective to cause the voltmeter to be essentially immune to variations due to electrostatic fields in the vicinity of high tension transmission lines.

2. The voltmeter as set forth in claim 1 wherein said rectifier network is a single phase full wave rectifier.

3. The voltmeter as set forth in claim 1 further including a current transformer intermediate said single probe and said ammeter, for measuring a voltage potential of less than five kilovolts.

4. The voltmeter as set forth in claim 3 wherein said ammeter is connected across a single phase full wave rectifier.

5. The voltmeter as set forth in claim 1 wherein the capacitance means is a spherical plate forming an electrically conducting spherical shell.

6. A single probe voltmeter for providing an indication of the voltage potential of a line, said voltmeter comprising:
    a. a single probe electrically contactable to the line under test for conveying a flow of current from the line;
    b. a capacitance means electrically connected to the line through said single probe;
    c. said capacitance means comprising an electrically conducting spherical shell;
    d. a rectifier network electrically disposed intermediate said single probe and said spherical capacitance means for rectifying the current flowing through said single probe to said spherical capacitance means; and
    e. an ammeter electrically disposed across said rectifier network and physically disposed within said spherical shell,
    f. said ammeter being responsive to the current flowing through said rectifier network to change said spherical capacitance means;
    g. said ammeter being effective to provide an indication of the charging current which is reflective of the voltage potential of the line.

7. The voltmeter as set forth in claim 6 wherein said rectifier network is disposed within said spherical shell.

8. The voltmeter as set forth in claim 6 including a manually manipulated pole extending from said spherical shell.

9. The voltmeter as set forth in claim 6 wherein said spherical shell is less than 10 inches in diameter.

* * * * *